United States Patent [19]
Ikuina et al.

[11] Patent Number: 5,989,484
[45] Date of Patent: Nov. 23, 1999

[54] MULTILAYER GLASS CERAMIC SUBSTRATE AND PROCESS FOR PRODUCING THE SAME

[75] Inventors: Kazuhiro Ikuina; Yuzo Shimada, both of Tokyo, Japan

[73] Assignee: NEC Corporation, Tokyo, Japan

[21] Appl. No.: 08/998,292

[22] Filed: Dec. 24, 1997

Related U.S. Application Data

[62] Division of application No. 08/846,820, Apr. 30, 1997, Pat. No. 5,753,376, which is a continuation of application No. 08/513,668, Aug. 4, 1995, abandoned, which is a continuation of application No. 08/073,725, Jun. 8, 1993, abandoned.

[30] Foreign Application Priority Data

| Jun. 8, 1992 | [JP] | Japan | ..................... 4-147029 |
| Jun. 8, 1992 | [JP] | Japan | ..................... 4-147030 |
| Jun. 8, 1992 | [JP] | Japan | ..................... 4-147031 |
| Jun. 18, 1992 | [JP] | Japan | ..................... 4-159070 |

[51] Int. Cl.$^6$ .................................................. B32B 17/02
[52] U.S. Cl. ........................................... 264/618; 264/619
[58] Field of Search ..................................... 264/618, 619

[56] References Cited

U.S. PATENT DOCUMENTS

| 4,861,646 | 8/1989 | Barringer | ................................. 428/210 |
| 5,753,376 | 5/1998 | Ikuina | ..................... 428/469 |

*Primary Examiner*—Timothy Speer
*Attorney, Agent, or Firm*—J. Warren Whitesel; Laff, Whitesel & Saret, Ltd.

[57] ABSTRACT

A multilayer glass ceramic substrate having a plurality of conductor layers each laminated through a glass ceramic layer. The glass ceramic layer has a composition comprising of alumina, borosilicate magnesium glass and cordierite crystal produced by chemical reaction between alumina and borosilicate magnesium glass. The content of alumina is 12 to 59.6 wt %, the content of borosilicate magnesium glass is 18 to 69.6 wt %, the content of the cordierite crystal is 1 to 50 wt % and the sum of components is 100 wt %. The multilayer glass ceramic substrate shows improved mechanical strength.

8 Claims, No Drawings

MULTILAYER GLASS CERAMIC SUBSTRATE AND PROCESS FOR PRODUCING THE SAME

This is a division of Ser. No. 08/846,820 filed Apr. 30, 1997, now U.S. Pat. No. 5,753,376; which was a continuation of Ser. No. 08/513,668, Aug. 4, 1995, abandoned, which is a continuation of Ser. No. 08/073,725 Jun. 8, 1993 now abandoned.

BACKGROUND OF THE INVENTION

1. Field of the Invention

The present invention relates to a multilayer glass ceramic substrate used for high density implementation of LSI elements and more specifically to a multilayer glass ceramic substrate which can be sintered at low temperatures and to a process for producing the same.

2. Description of the Related Arts

Development of semiconductor technology require downsizing and high-speed of electronics devices and systems. In fact, as the semiconductor elements are integrated into VLSI and ULSI of high density, very high density and fine-processing are required in the implementation technique for assembling the elements. In particular, it is requested to increase the wiring density of the substrate on which semiconductor elements are implemented so as to comply with finer pattering and higher operation speed and to lower the dielectric constant of substrate materials.

Alumina multilayer substrate has been used widely. This substrate is produced by a thick film printed multilayer technique or a green sheet lamination technique. The latter technique is more advantageous so as to satisfy requirement of high-density integration. In the green sheet lamination technique, a plurality of thin ceramic green sheets each on which wiring lines are printed are laminated before integrated, so that it is easy to increase the wiring layers to a desired number and hence the wiring density can be increased comparing to the thick film printed multilayer technique.

Alumina ceramic, however, has such a demerit that sintering must be carried out above 1,500° C. which require to use, as wiring conductor, Mo, W metal having a relatively high electric resistance and hence it is difficult to realize fine wiring. Still more, the dielectric constant of alumina is about 10 which is too high for high-speed operation of signals.

Recently, ceramic materials which can be sintered at relatively lower temperatures have been developed so that low resistance conductors such as Au, Ag—Pd, Ag or Cu can be used. For example, a composite material consisting of alumina and borosilicate lead glass can be sintered at a low temperature below 1,000° C. to produce a multilayer substrate in which Au, Ag—Pd or Ag can be used as a wiring conductor. However, in this composite material, it is difficult to use wiring of Cu which is a base metal because the composite material contains lead and hence sintering can not be carried out in a reduction atmosphere. Still more, the electric constant of this composite material can not be lowered below 7.5.

Glass ceramic material using borosilicate glass is also know. This glass ceramic material can be sintered at a temperature lower than 1,000° C. in a reduction atmosphere and has lower dielectric constant of about 5.5, so that a multilayered structure having wiring lines of Cu can be realized simultaneously at the sintering of glass ceramic. Known glass ceramic material, however, possess very poor mechanical strength because no crystallization occur by the sintering.

The mechanical strength is a very important factor of the substrate. In fact, in the case of a multi-chip implementation substrate on which a large number of semiconductor elements are implemented, the substrate size increases and input/output terminals or pins are connected at different levels, if the he mechanical strength of the substrate is poor, problems of breakage of the substrate, junction failure or the like occur in assembly stage and on a product.

An object of the present invention is to resolve the problems of conventional implementation substrate and to provide a multilayer glass ceramic substrate which can be sintered at a low temperature below 1,000° C. in neutral and reduction atmosphere in addition to oxidation atmosphere and which has a low dielectric constant and improved mechanical strength.

The multilayer glass ceramic substrate according to the present invention can be used as an implementation substrate for high-density fine-wiring and high speed, since low resistance metals such as Au, Ag, Cu, Ag—Pd or the like can be used as wiring conductor.

SUMMARY OF THE INVENTION

The present invention provides a multilayer glass ceramic substrate having a plurality of conductor layers each laminated through a glass ceramic layer, characterized in that the glass ceramic layer has a composition comprising of alumina, borosilicate magnesium glass and cordierite crystal produced by chemical reaction between alumina and borosilicate magnesium glass, the content of alumina being 12 to 59.6 wt %, the content of borosilicate magnesium glass being 18 to 69.6 wt % and the content of the cordierite crystal being 1 to 50 wt %, the sum of components being 100 wt %.

The composition can contain a forth component selected from a group consisting of silica glass, α-quartz and mullite. The content of the forth component is 10 to 30 wt %, the sum of components being 100 wt %.

The present invention provides also a process for producing a multilayer glass ceramic substrate by the steps of mixing material powders, preparing green sheets from slurry of the mixed material powders, forming via halls in the green sheets, printing wiring conductors on the green sheets and filling the via halls with conductor, laminating a plurality printed sheets, compressing the laminated sheets under heat and then sintering compressed sheets at a temperature below 1,000° C., characterized in that the mixed material powders consist of 30 to 60 wt % of alumina powder and 70 to 40 wt % of borosilicate magnesium glass powder.

In the process according to the present invention, cordierite crystals are produce when alumina powder and borosilicate magnesium glass powder are sintered.

Alumina powder has preferably the average particle size of 0.5 to 3 μm and borosilicate magnesium glass powder has preferably the average particle size of 1 to 5 μm.

In a variation of the process according to the present invention, a third powder selected from a group consisting of silica glass, α-quartz and mullite is added to the material powders in such proportions as 10 to 50 wt % of alumina powder, 40 to 70 wt % of borosilicate magnesium glass powder and 10 to 50 wt % of the third powder, the sum of all powders being 100 wt %.

The third powder has preferably the average particle size of 0.5 to 10 μm.

The content of magnesium in the borosilicate magnesium glass is preferably more than 5 wt % in term of magnesium oxide.

In the process according to the present invention, the material powders or green sheets are sintered below 1,000° C. to produce a multilayer glass ceramic substrate having improved properties because of following reason. In the sintering, borosilicate magnesium glass start to be softened at about 700° C. The resulting liquidized glass penetrate into and fill in spaces or clearances among ceramic powders of alumina, among ceramic powders of alumina and cordierite crystals and among ceramic powders of alumina, cordierite crystals and silica glass, α-silica or mullite to produce packed structure and a completely compacted glass ceramic body is formed finally at a temperature range form 800 to 1,000° C.

The material powders or green sheets of the present invention can be sintered in a reduction atmosphere because the material powders of the present invention do not contain such element that is reduced to elemental metal from oxide under the sintering condition. To the contrary, in the case of known material powders containing for example lead oxide, lead oxide is converted, in the reduction atmosphere, to metal lead which seriously deteriorate the insulation property of the resulting glass ceramic body obtained.

The multilayer glass ceramic substrate according to the present invention possesses improved mechanical strength which is one of very important properties required in implementation of semiconductor elements. Usually, the bending strength of higher than 2,000 kg/cm$^2$ is required in the substrate for implementing semiconductor elements. The multilayer glass ceramic substrate according to the present invention satisfies this strength because a compacted fine structure is realized by the sintering. In fact, the reaction between alumina and liquidized glass produces the cordierite crystal, so that the resulting glass ceramic obtained by the sintering possess a fine strong structure in which particles of alumina, particles of cordierite crystal (and also particles of quart glass, α-quartz or mullite, if they exist) and glassy mass are bonded three-dimensionally and which has an improved bending strength.

In the process according to the present invention, sintering can be effected below 1,000° C., the multilayer structure can be easily realized by the green sheet lamination technique and any conductor including basic metals such as Cu, Ni, their alloys or those that must be sintered in neutral or reduction atmosphere in addition to noble metals of Au, Ag, Pd, Pt or the like can be used.

The multilayer glass ceramic substrate according to the present invention possesses improved mechanical strength or bending strength of higher than 2,000 kg/cm$^2$ and low dielectric constant and makes it possible to realize fine wiring with high implementation density.

DESCRIPTION OF THE PREFERRED EMBODIMENT

Now, Examples of the present invention is explained but the present invention is not limited to the Examples.

Example 1

(Alumina+Borosilicate Magnesium Glass)

As material powders, alumina powder and borosilicate magnesium glass powder were used.

Alumina powder having the average particle size of 0.5 μm to 3 μm and borosilicate magnesium glass powder having the average particle size of 1 to 5 μm were intimately mixed at a proportion range from 30 wt %:70 wt % to 60 wt %:40 wt %.

Borosilicate magnesium glass used have following composition by weight:

| | | | |
|---|---|---|---|
| $B_2O_5$ | 15 | CaO | 1 |
| $SiO_2$ | 65 | BaO | 1 |
| MgO | 12 | $TiO_2$ | 1 |
| $Na_2O$ | 2 | $ZrO_2$ | 1 |
| $K_2O$ | 2 | | |

The resulting mixed material powder was dispersed together with an organic binder of polyvinyl butyral, polyvinyl alcohol or polyacrylic resin in a solvent to prepare a slurry from which a green sheet was molded by slip casting technique. The thickness of the green sheet was adjusted in a range from 10 to 400 μm.

Then, via halls connecting upper and lower conductors were formed in the green sheet by a punching machine. A wiring pattern was printed by screen printing technique with conductor past and the via halls were filled with the conductor past. The conductor past used consisted mainly of Au, Ag, Ag—Pd, Cu, Ni or Ag—Pt.

Predetermined numbers of green sheets each on which the conductor pattern was printed and of which the via hall was filled were laminated and compacted under heat. Then, the laminated green sheets were heated to a temperature of 400 to 700° C. to remove the organic binder and the solvent (elimination of binder).

Finally, the laminated green sheets were sintered at a temperature ranging form 800 to 1,000° C. to obtain a multilayer glass ceramic substrate. During this sintering stage, the cordierite crystal is produced by a chemical reaction between alumina and borosilicate magnesium glass and the softened glass mass penetrate into and fill spaces or clearances among particles so as to promote compacted structure.

Composition of glass ceramic layer of sintered substrates obtained are summarized in Table 1. The composition was determined by usual X-ray diffraction method. The contents of alumina and cordierite crystal which are determined by comparing their peaks to a peak of silicon used as a reference and a proportion of borosilicate magnesium glass is calculated by subtracting their contents from the total.

Conductor, sintering conditions, numbers of layers and wiring specification used for manufacturing multilayer glass ceramic substrates as well as the results obtained are summarized in Tables 2 and 3. The sample numbers in Table 1 correspond to those in Tables 2 and 3.

TABLE 1

Alumina + borosilicate magnesium glass

Composition ratio (wt %)

| Sample Number | Alumina | Borosilicate glass | Cordierite crystal |
|---|---|---|---|
| 1 | 12 | 38 | 50 |
| 2 | 12 | 43 | 45 |
| 3 | 12 | 48 | 40 |
| 4 | 17.4 | 32.6 | 50 |
| 5 | 18.1 | 37.6 | 44.3 |
| 6 | 18.2 | 50.1 | 31.7 |
| 7 | 22.0 | 29.1 | 48.9 |
| 8 | 23.2 | 39.5 | 37.3 |
| 9 | 23.3 | 48.7 | 28.0 |
| 10 | 23.5 | 57.3 | 19.2 |
| 11 | 27.9 | 29.8 | 42.3 |

TABLE 1-continued

Alumina + borosilicate magnesium glass

Composition ratio (wt %)

| Sample Number | Alumina | Borosilicate glass | Cordierite crystal |
|---|---|---|---|
| 12 | 28.1 | 41.0 | 30.9 |
| 13 | 28.1 | 50.5 | 21.4 |
| 14 | 28.3 | 61.8 | 9.9 |
| 15 | 33.2 | 18.9 | 47.8 |
| 16 | 33.3 | 31.6 | 35.1 |
| 17 | 33.3 | 35.3 | 31.4 |
| 18 | 33.5 | 46.9 | 19.6 |
| 19 | 38.4 | 27.7 | 33.9 |
| 20 | 38.4 | 31.4 | 30.2 |
| 21 | 38.7 | 34.7 | 26.6 |
| 22 | 38.8 | 50.7 | 10.5 |
| 23 | 42.0 | 18.0 | 40 |
| 24 | 42.1 | 33.8 | 24.1 |
| 25 | 42.1 | 37.3 | 20.6 |
| 26 | 42.3 | 43.2 | 14.5 |
| 27 | 46.3 | 38.2 | 15.5 |
| 28 | 46.3 | 43.7 | 10.0 |
| 29 | 48.4 | 18.0 | 33.6 |
| 30 | 48.6 | 20.9 | 30.5 |
| 31 | 48.7 | 29.8 | 21.5 |
| 32 | 48.7 | 35.2 | 16.1 |
| 33 | 52.5 | 21.8 | 25.7 |
| 34 | 52.5 | 27.4 | 20.1 |
| 35 | 52.6 | 30.3 | 17.1 |
| 36 | 52.8 | 34.1 | 13.1 |
| 37 | 56.1 | 29.8 | 14.1 |
| 38 | 56.3 | 33.7 | 10 |
| 39 | 56.3 | 38.5 | 5.2 |
| 40 | 56.5 | 42.5 | 1.0 |

TABLE 2

| Sample No | Sintering Temperature (° C.) | Conductor | Sintering Atmosphere | Number of Layers (Layer) | Size of Wire | | | Specific Inductive Capacity | Coefficient of Thermal Expansion ($\times 10^{-7}$ deg$^{-1}$) | Breaking Strength (kg/cm$^2$) | Insulation Resistance (Ω-cm) |
|---|---|---|---|---|---|---|---|---|---|---|---|
| | | | | | Wire Width ($\mu$m) | Wire Pitch ($\mu$m) | Via Diameter ($\mu$m) | | | | |
| 1 | 900 | Ag | Air | 30 | 120 | 300 | 150 | 5.4 | 40 | 2200 | >10$^{13}$ |
| 2 | 900 | Ag | Air | 30 | 120 | 300 | 150 | 5.3 | 41 | 2300 | >10$^{13}$ |
| 3 | 910 | Ag—Pd | Air | 30 | 120 | 300 | 150 | 5.2 | 43 | 2300 | >10$^{13}$ |
| 4 | 880 | Cu | N$_2$ | 30 | 120 | 250 | 120 | 5.5 | 40 | 2200 | >10$^{13}$ |
| 5 | 850 | Cu | N$_2$ | 30 | 120 | 250 | 120 | 5.5 | 43 | 2300 | >10$^{13}$ |
| 6 | 850 | Cu | N$_2$ | 30 | 120 | 250 | 120 | 5.1 | 46 | 2600 | >10$^{13}$ |
| 7 | 900 | Cu | N$_2$ + H$_2$ | 40 | 150 | 300 | 150 | 5.8 | 40 | 2300 | >10$^{13}$ |
| 8 | 910 | Cu | N$_2$ + H$_2$ | 40 | 150 | 300 | 150 | 5.6 | 44 | 2300 | >10$^{13}$ |
| 9 | 900 | Ag | Air | 40 | 150 | 300 | 150 | 5.3 | 48 | 2400 | >10$^{13}$ |
| 10 | 900 | Ag | Air | 40 | 150 | 300 | 150 | 5.0 | 49 | 2600 | >10$^{13}$ |
| 11 | 890 | Ag | Air | 40 | 150 | 300 | 200 | 5.8 | 43 | 2700 | >10$^{13}$ |
| 12 | 880 | Ag | Air | 40 | 150 | 300 | 200 | 5.6 | 47 | 2500 | >10$^{13}$ |
| 13 | 900 | Ag—Pd | Air | 40 | 150 | 300 | 200 | 5.5 | 49 | 2400 | >10$^{13}$ |
| 14 | 880 | Ag—Pd | Air | 30 | 150 | 300 | 200 | 5.2 | 52 | 2600 | >10$^{13}$ |
| 15 | 880 | Ag—Pd | Air | 30 | 100 | 200 | 100 | 6.5 | 41 | 2600 | >10$^{13}$ |
| 16 | 900 | Ag—Pd | Air | 30 | 100 | 200 | 100 | 6.2 | 45 | 2400 | >10$^{13}$ |
| 17 | 870 | Ag | Air | 30 | 100 | 250 | 120 | 6.2 | 46 | 2500 | >10$^{13}$ |
| 18 | 850 | Ag | Air | 30 | 100 | 250 | 120 | 6.0 | 49 | 2500 | >10$^{13}$ |
| 19 | 890 | Ag | Air | 30 | 100 | 250 | 120 | 6.2 | 47 | 2700 | >10$^{13}$ |
| 20 | 900 | Ag | Air | 35 | 100 | 300 | 150 | 6.1 | 47 | 2500 | >10$^{13}$ |

TABLE 3

| Sample No | Sintering Temperature (° C.) | Conductor | Sintering Atmosphere | Number of Layers (Layer) | Size of Wire | | | Specific Inductive Capacity | Coefficient of Thermal Expansion (× $10^{-7}$ deg$^{-1}$) | Breaking Strength (kg/cm$^2$) | Insulation Resistance (Ω-cm) |
|---|---|---|---|---|---|---|---|---|---|---|---|
| | | | | | Wire Width (μm) | Wire Pitch (μm) | Via Diameter (μm) | | | | |
| 21 | 900 | Cu | N$_2$ | 35 | 100 | 300 | 150 | 6.1 | 43 | 2500 | >$10^{13}$ |
| 22 | 850 | Cu | N$_2$ | 35 | 100 | 300 | 150 | 5.8 | 48 | 2800 | >$10^{13}$ |
| 23 | 930 | Cu | N$_2$ | 35 | 100 | 300 | 150 | 6.8 | 39 | 2400 | >$10^{13}$ |
| 24 | 900 | Cu | N$_2$ | 40 | 150 | 300 | 150 | 6.1 | 45 | 2500 | >$10^{13}$ |
| 25 | 910 | Cu | N$_2$ + H$_2$ | 40 | 150 | 350 | 150 | 5.9 | 48 | 2500 | >$10^{13}$ |
| 26 | 900 | Au | Air | 40 | 150 | 350 | 150 | 5.8 | 50 | 2600 | >$10^{13}$ |
| 27 | 900 | Ag | Air | 40 | 150 | 250 | 150 | 5.8 | 51 | 2700 | >$10^{13}$ |
| 28 | 880 | Cu | N$_2$ | 40 | 150 | 250 | 150 | 6.2 | 53 | 2800 | >$10^{13}$ |
| 29 | 950 | Cu | N$_2$ | 40 | 120 | 300 | 120 | 6.7 | 45 | 2500 | >$10^{13}$ |
| 30 | 930 | Ag—Pd | Air | 30 | 120 | 300 | 120 | 6.6 | 47 | 2500 | >$10^{13}$ |
| 31 | 900 | Ag—Pd | Air | 30 | 120 | 300 | 120 | 6.4 | 49 | 2400 | >$10^{13}$ |
| 32 | 900 | Au | Air | 30 | 120 | 300 | 120 | 6.2 | 51 | 2300 | >$10^{13}$ |
| 33 | 930 | Cu | N$_2$ | 30 | 120 | 250 | 100 | 6.7 | 48 | 2400 | >$10^{13}$ |
| 34 | 910 | Cu | N$_2$ | 30 | 120 | 250 | 100 | 6.5 | 50 | 2400 | >$10^{13}$ |
| 35 | 950 | Ag—Pd | Air | 30 | 120 | 250 | 100 | 6.4 | 51 | 2300 | >$10^{13}$ |
| 36 | 950 | Ag—Pd | Air | 30 | 100 | 200 | 80 | 6.4 | 51 | 2300 | >$10^{13}$ |
| 37 | 930 | Ag—Pd | Air | 40 | 100 | 250 | 120 | 6.7 | 50 | 2400 | >$10^{13}$ |
| 38 | 960 | Ag—Pd | Air | 40 | 100 | 250 | 120 | 6.5 | 52 | 2300 | >$10^{13}$ |
| 39 | 900 | Ag | Air | 40 | 100 | 250 | 120 | 6.4 | 54 | 2200 | >$10^{13}$ |
| 40 | 900 | Cu | N$_2$ | 40 | 80 | 200 | 80 | 6.5 | 55 | 2100 | >$10^{13}$ |

Tables 2 and 3 reveal such facts that multilayer glass ceramic substrates having the compositions according to the present invention shown in Table 1 posses improved properties required in practical uses including satisfactory mechanical strength and that fine wiring of high-density can made easily.

On the contrary, when the content of alumina is less than 12 wt %, the bending strength of substrate become lower than 2,000 kg/cm$^2$ and is insufficient. If the alumina content exceed 59.6 wt %, sintering can not be carried out below 1,000° C. so that the insulation resistance decrease and that the bending strength become lower than 2,000 kg/cm$^2$ and the dielectric constant becomes higher than 7, which is disadvantageous for high-speed circuits. In these cases, practical multilayer glass ceramic substrate can not be produced.

When the content of borosilicate magnesium glass is not higher than 18 wt %, it is impossible to obtain a glass phase sufficient to fill spaces or clearances among alumina particles, so that the strength become lower and the reliability can not be expected. If the content of borosilicate magnesium glass exceed 69.6 wt %, the strength intrinsic to glass dominates so that the bending strength become less than 2,000 kg/cm$^2$.

If the content of the cordierite crystal is less than 1 wt %, the effect for reinforcing the strength obtained by the presence of cordierite crystals can not be expected so that it is impossible to obtain the bending strength of more than 2,000 kg/cm$^2$. If the content of the cordierite crystal exceed 50 wt %, the multilayer glass ceramic substrate does not shrink uniformly and hence the reliability is lost.

If the content of magnesium in the borosilicate magnesium glass used as a material powder becomes less than 5 wt % in term of magnesium oxide, no or little cordierite crystal is produced by sintering operation.

If the particle size of alumina powder used becomes lower than 0.5 μm or higher than 3 μm, and if the particle size of borosilicate magnesium glass powder become lower than 1 μm or higher than 5 μm, the mixed material powder can not be sintered satisfactorily, so that the resulting multilayer glass ceramic substrate shows very poor reliability and hence can not be used in practical uses.

Example 2

(Alumina+Borosilicate Magnesium Glass+Silica Glass)

Example 1 is repeated except silica glass was added to the material powders of alumina powder and borosilicate magnesium glass powder.

Namely, alumina powder having the average particle size of 0.5 μm to 3 μm, borosilicate magnesium glass powder having the average particle size of 1 to 5 μm and silica glass powder having the average particle size of 0.5 μm to 10 μm were intimately mixed at a proportion of (alumina+silica glass): borosilicate magnesium glass of from 30 wt %:70 wt % to 60 wt %:40 wt %. The proportion of alumina powder was adjusted above 10 wt %.

Composition of glass ceramic layer of sintered substrates obtained are summarized in Table 4 and conductor, sintering conditions, numbers of layers and wiring specification used for manufacturing multilayer glass ceramic substrates as well as the results obtained are summarized in Tables 5 and 6. The sample numbers in Table 4 correspond to those in Tables 5 and 6.

TABLE 4

Alumina + borosilicate magnesium glass + silica glass

| | Composition ratio (wt %) | | | |
|---|---|---|---|---|
| Sample Number | Alumina | Silica glass | Borosilicate type Glass | Cordierite crystal |
| 101 | 12.0 | 21.0 | 37.0 | 30.0 |
| 102 | 12.0 | 30.0 | 33.0 | 25.0 |
| 103 | 12.4 | 11.0 | 69.6 | 20.0 |
| 104 | 17.0 | 25.0 | 32.0 | 26.0 |
| 105 | 17.0 | 10.0 | 23.0 | 50.0 |
| 106 | 18.0 | 21.0 | 40.0 | 21.0 |
| 107 | 22.0 | 18.0 | 25.0 | 35.0 |
| 108 | 23.0 | 15.0 | 27.0 | 35.0 |
| 109 | 23.0 | 19.0 | 38.0 | 20.0 |
| 110 | 23.0 | 24.0 | 20.0 | 33.0 |
| 111 | 28.0 | 20.0 | 19.0 | 33.0 |

TABLE 4-continued

Alumina + borosilicate magnesium glass + silica glass

Composition ratio (wt %)

| Sample Number | Alumina | Silica glass | Borosilicate type Glass | Cordierite crystal |
|---|---|---|---|---|
| 112 | 28.0 | 11.0 | 51.0 | 10.0 |
| 113 | 28.0 | 17.0 | 40.0 | 15.0 |
| 114 | 28.0 | 17.0 | 35.0 | 20.0 |
| 115 | 33.0 | 17.0 | 36.0 | 14.0 |
| 116 | 33.0 | 12.0 | 25.0 | 30.0 |
| 117 | 33.0 | 18.0 | 20.0 | 29.0 |
| 118 | 34.0 | 10.0 | 45.0 | 11.0 |
| 119 | 38.0 | 19.0 | 18.0 | 25.0 |
| 120 | 38.0 | 24.0 | 24.0 | 14.0 |
| 121 | 39.0 | 15.0 | 28.0 | 18.0 |
| 122 | 39.0 | 11.0 | 40.0 | 10.0 |
| 123 | 42.0 | 11.0 | 18.0 | 29.0 |
| 124 | 42.0 | 12.0 | 28.0 | 18.0 |
| 125 | 42.0 | 10.0 | 30.0 | 18.0 |
| 126 | 42.5 | 13.0 | 34.5 | 10.0 |
| 127 | 46.0 | 10.0 | 31.0 | 23.0 |
| 128 | 46.0 | 11.0 | 33.0 | 10.0 |
| 129 | 48.0 | 11.0 | 18.0 | 23.0 |
| 130 | 48.0 | 12.0 | 21.0 | 19.0 |
| 131 | 49.0 | 10.0 | 21.0 | 20.0 |
| 132 | 49.0 | 15.0 | 26.0 | 10.0 |
| 133 | 52.0 | 12.0 | 18.0 | 18.0 |
| 134 | 52.0 | 12.0 | 20.0 | 16.0 |
| 135 | 53.0 | 11.0 | 22.0 | 14.0 |
| 136 | 53.0 | 11.0 | 24.0 | 12.0 |
| 137 | 56.0 | 10.0 | 25.0 | 9.0 |
| 138 | 56.0 | 10.0 | 21.0 | 13.0 |
| 139 | 57.0 | 10.0 | 24.0 | 9.0 |
| 140 | 59.6 | 10.0 | 19.4 | 11.0 |

TABLE 5

| Sample No | Sintering Temperature (° C.) | Conductor | Sintering Atmosphere | Number of Layers (Layer) | Wire Width (μm) | Wire Pitch (μm) | Via Diameter (μm) | Specific Inductive Capacity | Coefficient of Thermal Expansion (× $10^{-7}$ $deg^{-1}$) | Breaking Strength (kg/cm$^2$) | Insulation Resistance (Ω-cm) |
|---|---|---|---|---|---|---|---|---|---|---|---|
| 101 | 900 | Ag | Air | 30 | 120 | 300 | 150 | 5.0 | 40 | 2200 | >$10^{13}$ |
| 102 | 900 | Ag | Air | 30 | 120 | 300 | 150 | 4.9 | 41 | 2300 | >$10^{13}$ |
| 103 | 910 | Ag—Pd | Air | 30 | 120 | 300 | 150 | 4.8 | 43 | 2300 | >$10^{13}$ |
| 104 | 880 | Cu | $N_2$ | 30 | 120 | 250 | 120 | 5.1 | 40 | 2200 | >$10^{13}$ |
| 105 | 850 | Cu | $N_2$ | 30 | 120 | 250 | 120 | 5.5 | 43 | 2300 | >$10^{13}$ |
| 106 | 850 | Cu | $N_2$ | 30 | 120 | 250 | 120 | 4.7 | 46 | 2600 | >$10^{13}$ |
| 107 | 900 | Cu | $N_2 + H_2$ | 40 | 150 | 300 | 150 | 5.4 | 40 | 2300 | >$10^{13}$ |
| 108 | 910 | Cu | $N_2 + H_2$ | 40 | 150 | 300 | 150 | 5.2 | 44 | 2300 | >$10^{13}$ |
| 109 | 900 | Ag | Air | 40 | 150 | 300 | 150 | 4.9 | 48 | 2400 | >$10^{13}$ |
| 110 | 900 | Ag | Air | 40 | 150 | 300 | 150 | 4.6 | 49 | 2600 | >$10^{13}$ |
| 111 | 890 | Ag | Air | 40 | 150 | 300 | 200 | 5.4 | 43 | 2700 | >$10^{13}$ |
| 112 | 880 | Ag | Air | 40 | 150 | 300 | 200 | 5.2 | 47 | 2500 | >$10^{13}$ |
| 113 | 900 | Ag—Pd | Air | 40 | 150 | 300 | 200 | 5.1 | 49 | 2400 | >$10^{13}$ |
| 114 | 880 | Ag—Pd | Air | 30 | 150 | 300 | 200 | 4.8 | 52 | 2600 | >$10^{13}$ |
| 115 | 880 | Ag—Pd | Air | 30 | 100 | 200 | 100 | 6.1 | 41 | 2600 | >$10^{13}$ |
| 116 | 900 | Ag—Pd | Air | 30 | 100 | 200 | 100 | 5.8 | 45 | 2400 | >$10^{13}$ |
| 117 | 870 | Ag | Air | 30 | 100 | 250 | 120 | 5.8 | 46 | 2500 | >$10^{13}$ |
| 118 | 850 | Ag | Air | 30 | 100 | 250 | 120 | 5.6 | 49 | 2500 | >$10^{13}$ |
| 119 | 890 | Ag | Air | 30 | 100 | 250 | 120 | 5.8 | 47 | 2700 | >$10^{13}$ |
| 120 | 900 | Ag | Air | 35 | 100 | 300 | 150 | 5.7 | 47 | 2500 | >$10^{13}$ |

TABLE 6

| Sample No | Sintering Temperature (° C.) | Conductor | Sintering Atmosphere | Number of Layers (Layer) | Wire Width (μm) | Wire Pitch (μm) | Via Diameter (μm) | Specific Inductive Capacity | Coefficient of Thermal Expansion (× 10$^{-7}$ deg$^{-1}$) | Breaking Strength (kg/cm$^2$) | Insulation Resistance (Ω-cm) |
|---|---|---|---|---|---|---|---|---|---|---|---|
| 121 | 900 | Cu | N$_2$ | 35 | 100 | 300 | 150 | 5.7 | 43 | 2500 | >10$^{13}$ |
| 122 | 850 | Cu | N$_2$ | 35 | 100 | 300 | 150 | 5.4 | 48 | 2800 | >10$^{13}$ |
| 123 | 930 | Cu | N$_2$ | 35 | 100 | 300 | 150 | 6.4 | 39 | 2400 | >10$^{13}$ |
| 124 | 900 | Cu | N$_2$ | 40 | 150 | 300 | 150 | 5.7 | 45 | 2500 | >10$^{13}$ |
| 125 | 910 | Cu | N$_2$ + H$_2$ | 40 | 150 | 350 | 150 | 5.5 | 48 | 2500 | >10$^{13}$ |
| 126 | 900 | Au | Air | 40 | 150 | 350 | 150 | 5.4 | 50 | 2600 | >10$^{13}$ |
| 127 | 900 | Ag | Air | 40 | 150 | 250 | 150 | 5.4 | 51 | 2700 | >10$^{13}$ |
| 128 | 880 | Cu | N$_2$ | 40 | 150 | 250 | 150 | 5.8 | 53 | 2800 | >10$^{13}$ |
| 129 | 950 | Cu | N$_2$ | 40 | 120 | 300 | 120 | 6.3 | 45 | 2500 | >10$^{13}$ |
| 130 | 930 | Ag—Pd | Air | 30 | 120 | 300 | 120 | 6.2 | 47 | 2500 | >10$^{13}$ |
| 131 | 900 | Ag—Pd | Air | 30 | 120 | 300 | 120 | 6.0 | 49 | 2400 | >10$^{13}$ |
| 132 | 900 | Au | Air | 30 | 120 | 300 | 120 | 5.8 | 51 | 2300 | >10$^{13}$ |
| 133 | 930 | Cu | N$_2$ | 30 | 120 | 250 | 100 | 6.3 | 48 | 2400 | >10$^{13}$ |
| 134 | 910 | Cu | N$_2$ | 30 | 120 | 250 | 100 | 6.1 | 50 | 2400 | >10$^{13}$ |
| 135 | 950 | Ag—Pd | Air | 30 | 120 | 250 | 100 | 6.0 | 51 | 2300 | >10$^{13}$ |
| 136 | 950 | Ag—Pd | Air | 30 | 100 | 200 | 80 | 6.0 | 51 | 2300 | >10$^{13}$ |
| 137 | 930 | Ag—Pd | Air | 40 | 100 | 250 | 120 | 6.3 | 50 | 2400 | >10$^{13}$ |
| 138 | 960 | Ag—Pd | Air | 40 | 100 | 250 | 120 | 6.1 | 52 | 2300 | >10$^{13}$ |
| 139 | 900 | Ag | Air | 40 | 100 | 250 | 120 | 6.0 | 54 | 2200 | >10$^{13}$ |
| 140 | 900 | Cu | N$_2$ | 40 | 80 | 200 | 80 | 6.1 | 55 | 2100 | >10$^{13}$ |

When the content of silica glass powder is less than 10 wt %, the dielectric constant become higher than 7. On the other hand, if the content of silica glass powder exceed 30 wt %, satisfactory sintering can not be carried out so that the insulation resistance becomes lower and the bending strength become lower than 2,000 kg/cm$^2$.

When the particle size of alumina powder used becomes lower than 0.5 μm or higher than 3 μm, the particle size of borosilicate magnesium glass powder become lower than 1 μm or higher than 5 μm and the particle size of silica glass powder become lower than 0.5 μm or higher than 10 μm, the mixed material powder can not be sintered satisfactorily, so that the resulting multilayer glass ceramic substrate shows very poor reliability and hence can not be used in practical uses.

By the same reason as Example 1, practical multilayer glass ceramic substrate can not be obtained outside the proportions according to the present invention (12 to 59.6 wt % of alumina, 18 to 69.6 wt % of borosilicate magnesium glass and higher than 1 wt % of cordierite crystal).

By the same reason as Example 1, if the content of magnesium in the borosilicate magnesium glass used becomes less than 5 wt % in term of magnesium oxide, no or little cordierite crystal is produced by sintering operation.

Example 3

(Alumina+Borosilicate Magnesium Glass+Mullite)

Example 2 is repeated except silica glass was replaced by mullite powder.

Namely, alumina powder, borosilicate magnesium glass powder and mullite powder having the average particle size of 0.5 μm to 10 μm were intimately mixed at a proportion of (alumina+mullite): borosilicate magnesium glass of from 30 wt %:70 wt % to 60 wt %:40 wt %. The proportion of alumina powder was adjusted above 10 wt %.

Composition of glass ceramic layer of sintered substrates obtained are summarized in Table 7 and conductor, sintering conditions, numbers of layers and wiring specification used for manufacturing multilayer glass ceramic substrates as well as the results obtained are summarized in Tables 8 and 9. The sample numbers in Table 7 correspond to those in Tables 8 and 9.

TABLE 7

Alumina + borosilicate magnesium glass + mullite

| Sample Number | Composition ratio (wt %) | | | |
|---|---|---|---|---|
| | Alumina | Mullite | Borosilicate type Glass | Cordierite crystal |
| 201 | 12.0 | 21.0 | 37.0 | 30.0 |
| 202 | 12.0 | 30.0 | 33.0 | 25.0 |
| 203 | 12.4 | 11.0 | 69.6 | 20.0 |
| 204 | 17.0 | 25.0 | 32.0 | 26.0 |
| 205 | 17.0 | 10.0 | 23.0 | 50.0 |
| 206 | 18.0 | 21.0 | 40.0 | 21.0 |
| 207 | 22.0 | 18.0 | 25.0 | 35.0 |
| 208 | 23.0 | 15.0 | 27.0 | 35.0 |
| 209 | 23.0 | 19.0 | 38.0 | 20.0 |
| 210 | 23.0 | 24.0 | 20.0 | 33.0 |
| 211 | 28.0 | 20.0 | 19.0 | 33.0 |
| 212 | 28.0 | 11.0 | 51.0 | 10.0 |
| 213 | 28.0 | 17.0 | 40.0 | 15.0 |
| 214 | 28.0 | 17.0 | 35.0 | 20.0 |
| 215 | 33.0 | 17.0 | 36.0 | 14.0 |
| 216 | 33.0 | 12.0 | 25.0 | 30.0 |
| 217 | 33.0 | 18.0 | 20.0 | 29.0 |
| 218 | 34.0 | 10.0 | 45,0 | 11.0 |
| 219 | 38.0 | 19.0 | 18.0 | 25.0 |
| 220 | 38.0 | 24.0 | 24.0 | 14.0 |
| 221 | 39.0 | 15.0 | 28.0 | 18.0 |
| 222 | 39.0 | 11.0 | 40.0 | 10.0 |
| 223 | 42.0 | 11.0 | 18.0 | 29.0 |
| 224 | 42.0 | 12.0 | 28.0 | 18.0 |
| 225 | 42.0 | 10.0 | 30.0 | 18.0 |
| 226 | 42.5 | 13.0 | 34.5 | 10.0 |
| 227 | 46.0 | 10.0 | 31.0 | 23.0 |
| 228 | 46.0 | 11.0 | 33.0 | 10.0 |
| 229 | 48.0 | 11.0 | 18.0 | 23.0 |
| 230 | 48.0 | 12.0 | 21.0 | 19.0 |
| 231 | 49.0 | 10.0 | 21.0 | 20.0 |
| 232 | 49.0 | 15.0 | 26.0 | 10.0 |
| 233 | 52.0 | 12.0 | 18.0 | 18.0 |
| 234 | 52.0 | 12.0 | 20.0 | 16.0 |
| 235 | 53.0 | 11.0 | 22.0 | 14.0 |

TABLE 7-continued

Alumina + borosilicate magnesium glass + mullite

Composition ratio (wt %)

| Sample Number | Alumina | Mullite | Borosilicate type Glass | Cordierite crystal |
|---|---|---|---|---|
| 236 | 53.0 | 11.0 | 24.0 | 12.0 |
| 237 | 56.0 | 10.0 | 25.0 | 9.0 |
| 238 | 56.0 | 10.0 | 21.0 | 13.0 |
| 239 | 57.0 | 10.0 | 24.0 | 9.0 |
| 240 | 59.6 | 10.0 | 19.4 | 11.0 |

TABLE 8

| Sample No | Sintering Temperature (° C.) | Conductor | Sintering Atmosphere | Number of Layers (Layer) | Size of Wire | | | Specific Inductive Capacity | Coefficient of Thermal Expansion ($\times 10^{-7}$ deg$^{-1}$) | Breaking Strength (kg/cm$^2$) | Insulation Resistance (Ω-cm) |
|---|---|---|---|---|---|---|---|---|---|---|---|
| | | | | | Wire Width (μm) | Wire Pitch (μm) | Via Diameter (μm) | | | | |
| 201 | 900 | Ag | Air | 30 | 120 | 300 | 150 | 5.4 | 40 | 2200 | >10$^{13}$ |
| 202 | 900 | Ag | Air | 30 | 120 | 300 | 150 | 5.3 | 41 | 2300 | >10$^{13}$ |
| 203 | 910 | Ag—Pd | Air | 30 | 120 | 300 | 150 | 5.2 | 43 | 2300 | >10$^{13}$ |
| 204 | 880 | Cu | N$_2$ | 30 | 120 | 250 | 120 | 5.5 | 40 | 2200 | >10$^{13}$ |
| 205 | 850 | Cu | N$_2$ | 30 | 120 | 250 | 120 | 5.5 | 43 | 2300 | >10$^{13}$ |
| 206 | 850 | Cu | N$_2$ | 30 | 120 | 250 | 120 | 5.1 | 46 | 2600 | >10$^{13}$ |
| 207 | 900 | Cu | N$_2$ + H$_2$ | 40 | 150 | 300 | 150 | 5.8 | 40 | 2300 | >10$^{13}$ |
| 208 | 910 | Cu | N$_2$ + H$_2$ | 40 | 150 | 300 | 150 | 5.6 | 44 | 2300 | >10$^{13}$ |
| 209 | 900 | Ag | Air | 40 | 150 | 300 | 150 | 5.3 | 48 | 2400 | >10$^{13}$ |
| 210 | 900 | Ag | Air | 40 | 150 | 300 | 150 | 5.0 | 49 | 2600 | >10$^{13}$ |
| 211 | 890 | Ag | Air | 40 | 150 | 300 | 200 | 5.8 | 43 | 2700 | >10$^{13}$ |
| 212 | 880 | Ag | Air | 40 | 150 | 300 | 200 | 5.6 | 47 | 2500 | >10$^{13}$ |
| 213 | 900 | Ag—Pd | Air | 40 | 150 | 300 | 200 | 5.5 | 49 | 2400 | >10$^{13}$ |
| 214 | 880 | Ag—Pd | Air | 30 | 150 | 300 | 200 | 5.2 | 52 | 2600 | >10$^{13}$ |
| 215 | 880 | Ag—Pd | Air | 30 | 100 | 200 | 100 | 6.5 | 41 | 2600 | >10$^{13}$ |
| 216 | 900 | Ag—Pd | Air | 30 | 100 | 200 | 100 | 6.2 | 45 | 2400 | >10$^{13}$ |
| 217 | 870 | Ag | Air | 30 | 100 | 250 | 120 | 6.2 | 46 | 2500 | >10$^{13}$ |
| 218 | 850 | Ag | Air | 30 | 100 | 250 | 120 | 6.0 | 49 | 2500 | >10$^{13}$ |
| 219 | 890 | Ag | Air | 30 | 100 | 250 | 120 | 6.2 | 47 | 2700 | >10$^{13}$ |
| 220 | 900 | Ag | Air | 35 | 100 | 300 | 150 | 6.1 | 47 | 2500 | >10$^{13}$ |

TABLE 9

| Sample No | Sintering Temperature (° C.) | Conductor | Sintering Atmosphere | Number of Layers (Layer) | Size of Wire | | | Specific Inductive Capacity | Coefficient of Thermal Expansion ($\times 10^{-7}$ deg$^{-1}$) | Breaking Strength (kg/cm$^2$) | Insulation Resistance (Ω-cm) |
|---|---|---|---|---|---|---|---|---|---|---|---|
| | | | | | Wire Width (μm) | Wire Pitch (μm) | Via Diameter (μm) | | | | |
| 221 | 900 | Cu | N$_2$ | 35 | 100 | 300 | 150 | 6.1 | 43 | 2500 | >10$^{13}$ |
| 222 | 850 | Cu | N$_2$ | 35 | 100 | 300 | 150 | 5.8 | 48 | 2800 | >10$^{13}$ |
| 223 | 930 | Cu | N$_2$ | 35 | 100 | 300 | 150 | 6.8 | 39 | 2400 | >10$^{13}$ |
| 224 | 900 | Cu | N$_2$ | 40 | 150 | 300 | 150 | 6.1 | 45 | 2500 | >10$^{13}$ |
| 225 | 910 | Cu | N$_2$ + H$_2$ | 40 | 150 | 350 | 150 | 5.9 | 48 | 2500 | >10$^{13}$ |
| 226 | 900 | Au | Air | 40 | 150 | 350 | 150 | 5.8 | 50 | 2600 | >10$^{13}$ |
| 227 | 900 | Ag | Air | 40 | 150 | 250 | 150 | 5.8 | 51 | 2700 | >10$^{13}$ |
| 228 | 880 | Cu | N$_2$ | 40 | 150 | 250 | 150 | 6.2 | 53 | 2800 | >10$^{13}$ |
| 229 | 950 | Cu | N$_2$ | 40 | 120 | 300 | 120 | 6.7 | 45 | 2500 | >10$^{13}$ |
| 230 | 930 | Ag—Pd | Air | 30 | 120 | 300 | 120 | 6.6 | 47 | 2500 | >10$^{13}$ |
| 231 | 900 | Ag—Pd | Air | 30 | 120 | 300 | 120 | 6.4 | 49 | 2400 | >10$^{13}$ |
| 232 | 900 | Au | Air | 30 | 120 | 300 | 120 | 6.2 | 51 | 2300 | >10$^{13}$ |
| 233 | 930 | Cu | N$_2$ | 30 | 120 | 250 | 100 | 6.7 | 48 | 2400 | >10$^{13}$ |
| 234 | 910 | Cu | N$_2$ | 30 | 120 | 250 | 100 | 6.5 | 50 | 2400 | >10$^{13}$ |
| 235 | 950 | Ag—Pd | Air | 30 | 120 | 250 | 100 | 6.4 | 51 | 2300 | >10$^{13}$ |
| 236 | 950 | Ag—Pd | Air | 30 | 100 | 200 | 80 | 6.4 | 51 | 2300 | >10$^{13}$ |
| 237 | 930 | Ag—Pd | Air | 40 | 100 | 250 | 120 | 6.7 | 50 | 2400 | >10$^{13}$ |

TABLE 9-continued

| Sample No | Sintering Temperature (° C.) | Conductor | Sintering Atmosphere | Number of Layers (Layer) | Wire Width ($\mu$m) | Wire Pitch ($\mu$m) | Via Diameter ($\mu$m) | Specific Inductive Capacity | Coefficient of Thermal Expansion ($\times 10^{-7}$ deg$^{-1}$) | Breaking Strength (kg/cm$^2$) | Insulation Resistance ($\Omega$-cm) |
|---|---|---|---|---|---|---|---|---|---|---|---|
| 238 | 960 | Ag—Pd | Air | 40 | 100 | 250 | 120 | 6.5 | 52 | 2300 | >10$^{13}$ |
| 239 | 900 | Ag | Air | 40 | 100 | 250 | 120 | 6.4 | 54 | 2200 | >10$^{13}$ |
| 240 | 900 | Cu | N$_2$ | 40 | 80 | 200 | 80 | 6.5 | 55 | 2100 | >10$^{13}$ |

When the content of mullite powder is less than 10 wt %, the dielectric constant become higher than 7. On the other hand, if the content of mullite powder exceed 30 wt %, satisfactory sintering can not be carried out so that the insulation resistance becomes lower and the bending strength become lower than 2,000 kg/cm$^2$.

When the particle size of alumina powder used becomes lower than 0.5 $\mu$m or higher than 3 $\mu$m, the particle size of borosilicate magnesium glass powder become lower than 1 $\mu$m or higher than 5 $\mu$m and the particle size of mullite powder become lower than 0.5 $\mu$m or higher than 10 $\mu$m, the mixed material powder can not be sintered satisfactorily, so that the resulting multilayer glass ceramic substrate shows very poor reliability and hence can not be used in practical uses.

By the same reason as Example 2, practical multilayer glass ceramic substrate can not be obtained outside the proportions according to the present invention (12 to 59.6 wt % of alumina, 18 to 69.6 wt % of borosilicate magnesium glass and higher than 1 wt % of cordierite crystal).

By the same reason as Example 2, if the content of magnesium in the borosilicate magnesium glass used becomes less than 5 wt % in term of magnesium oxide, no or little cordierite crystal is produced by sintering operation.

Example 4

(Alumina+Borosilicate Magnesium Glass+α-quartz)

Example 2 is repeated except silica glass was replaced by α-quartz powder.

Namely, alumina powder, borosilicate magnesium glass powder and α-quartz powder having the average particle size of 0.5 $\mu$m to 10 $\mu$m were intimately mixed at a proportion of (alumina+α-quartz): borosilicate magnesium glass of from 30 wt %:70 wt % to 60 wt %:40 wt %. The proportion of alumina powder was adjusted above 10 wt %.

Composition of glass ceramic layer of sintered substrates obtained are summarized in Table 10 and conductor, sintering conditions, numbers of layers and wiring specification used for manufacturing multilayer glass ceramic substrates as well as the results obtained are summarized in Tables 11 and 12. The sample numbers in Table 10 correspond to those in Tables 11 and 12.

TABLE 10

Alumina + borosilicate magnesium glass + α-quartz

Composition ratio (wt %)

| Sample Number | Alumina | α-quartz | Borosilicate type Glass | Cordierite crystal |
|---|---|---|---|---|
| 301 | 12.0 | 21.0 | 37.0 | 30.0 |
| 302 | 12.0 | 30.0 | 33.0 | 25.0 |
| 303 | 12.4 | 11.0 | 69.6 | 20.0 |
| 304 | 17.0 | 25.0 | 32.0 | 26.0 |
| 305 | 17.0 | 10.0 | 23.0 | 50.0 |
| 306 | 18.0 | 21.0 | 40.0 | 21.0 |
| 307 | 22.0 | 18.0 | 25.0 | 35.0 |
| 308 | 23.0 | 15.0 | 27.0 | 35.0 |
| 309 | 23.0 | 19.0 | 38.0 | 20.0 |
| 310 | 23.0 | 24.0 | 20.0 | 33.0 |
| 311 | 28.0 | 20.0 | 19.0 | 33.0 |
| 312 | 28.0 | 11.0 | 51.0 | 10.0 |
| 313 | 28.0 | 17.0 | 40.0 | 15.0 |
| 314 | 28.0 | 17.0 | 35.0 | 20.0 |
| 315 | 33.0 | 17.0 | 36.0 | 14.0 |
| 316 | 33.0 | 12.0 | 25.0 | 30.0 |
| 317 | 33.0 | 18.0 | 20.0 | 29.0 |
| 318 | 34.0 | 10.0 | 45.0 | 11.0 |
| 319 | 38.0 | 19.0 | 18.0 | 25.0 |
| 320 | 38.0 | 24.0 | 24.0 | 14.0 |
| 321 | 39.0 | 15.0 | 28.0 | 18.0 |
| 322 | 39.0 | 11.0 | 40.0 | 10.0 |
| 323 | 42.0 | 11.0 | 18.0 | 29.0 |
| 324 | 42.0 | 12.0 | 28.0 | 18.0 |
| 325 | 42.0 | 10.0 | 30.0 | 18.0 |
| 326 | 42.5 | 13.0 | 34.5 | 10.0 |
| 327 | 46.0 | 10.0 | 31.0 | 23.0 |
| 328 | 46.0 | 11.0 | 33.0 | 10.0 |
| 329 | 48.0 | 11.0 | 18.0 | 23.0 |
| 330 | 48.0 | 12.0 | 21.0 | 19.0 |
| 331 | 49.0 | 10.0 | 21.0 | 20.0 |
| 332 | 49.0 | 15.0 | 26.0 | 10.0 |
| 333 | 52.0 | 12.0 | 18.0 | 18.0 |
| 334 | 52.0 | 12.0 | 20.0 | 16.0 |
| 335 | 53.0 | 11.0 | 22.0 | 14.0 |
| 336 | 53.0 | 11.0 | 24.0 | 12.0 |
| 337 | 56.0 | 10.0 | 25.0 | 9.0 |
| 338 | 56.0 | 10.0 | 21.0 | 13.0 |
| 339 | 57.0 | 10.0 | 24.0 | 9.0 |
| 340 | 59.6 | 10.0 | 19.4 | 11.0 |

TABLE 11

| Sample No | Sintering Temperature (° C.) | Conductor | Sintering Atmosphere | Number of Layers (Layer) | Size of Wire | | | Specific Inductive Capacity | Coefficient of Thermal Expansion ($\times 10^{-7}$ deg$^{-1}$) | Breaking Strength (kg/cm$^2$) | Insulation Resistance ($\Omega$-cm) |
|---|---|---|---|---|---|---|---|---|---|---|---|
| | | | | | Wire Width ($\mu$m) | Wire Pitch ($\mu$m) | Via Diameter ($\mu$m) | | | | |
| 301 | 900 | Ag | Air | 30 | 120 | 300 | 150 | 5.0 | 40 | 2200 | >10$^{13}$ |
| 302 | 900 | Ag | Air | 30 | 120 | 300 | 150 | 4.9 | 41 | 2300 | >10$^{13}$ |
| 303 | 910 | Ag—Pd | Air | 30 | 120 | 300 | 150 | 4.8 | 43 | 2300 | >10$^{13}$ |
| 304 | 880 | Cu | N$_2$ | 30 | 120 | 250 | 120 | 5.1 | 40 | 2200 | >10$^{13}$ |
| 305 | 850 | Cu | N$_2$ | 30 | 120 | 250 | 120 | 5.5 | 43 | 2300 | >10$^{13}$ |
| 306 | 850 | Cu | N$_2$ | 30 | 120 | 250 | 120 | 4.7 | 46 | 2600 | >10$^{13}$ |
| 307 | 900 | Cu | N$_2$ + H$_2$ | 40 | 150 | 300 | 150 | 5.4 | 40 | 2300 | >10$^{13}$ |
| 308 | 910 | Cu | N$_2$ + H$_2$ | 40 | 150 | 300 | 150 | 5.2 | 44 | 2300 | >10$^{13}$ |
| 309 | 900 | Ag | Air | 40 | 150 | 300 | 150 | 4.9 | 48 | 2400 | >10$^{13}$ |
| 310 | 900 | Ag | Air | 40 | 150 | 300 | 150 | 4.6 | 49 | 2600 | >10$^{13}$ |
| 311 | 890 | Ag | Air | 40 | 150 | 300 | 200 | 5.4 | 43 | 2700 | >10$^{13}$ |
| 312 | 880 | Ag | Air | 40 | 150 | 300 | 200 | 5.2 | 47 | 2500 | >10$^{13}$ |
| 313 | 900 | Ag—Pd | Air | 40 | 150 | 300 | 200 | 5.1 | 49 | 2400 | >10$^{13}$ |
| 314 | 880 | Ag—Pd | Air | 30 | 150 | 300 | 200 | 4.8 | 52 | 2600 | >10$^{13}$ |
| 315 | 880 | Ag—Pd | Air | 30 | 100 | 200 | 100 | 6.1 | 41 | 2600 | >10$^{13}$ |
| 316 | 900 | Ag—Pd | Air | 30 | 100 | 200 | 100 | 5.8 | 45 | 2400 | >10$^{13}$ |
| 317 | 870 | Ag | Air | 30 | 100 | 250 | 120 | 5.8 | 46 | 2500 | >10$^{13}$ |
| 318 | 850 | Ag | Air | 30 | 100 | 250 | 120 | 5.6 | 49 | 2500 | >10$^{13}$ |
| 319 | 890 | Ag | Air | 30 | 100 | 250 | 120 | 5.8 | 47 | 2700 | >10$^{13}$ |
| 320 | 900 | Ag | Air | 35 | 100 | 300 | 150 | 5.7 | 47 | 2500 | >10$^{13}$ |

TABLE 12

| Sample No | Sintering Temperature (° C.) | Conductor | Sintering Atmosphere | Number of Layers (Layer) | Size of Wire | | | Specific Inductive Capacity | Coefficient of Thermal Expansion ($\times 10^{-7}$ deg$^{-1}$) | Breaking Strength (kg/cm$^2$) | Insulation Resistance ($\Omega$-cm) |
|---|---|---|---|---|---|---|---|---|---|---|---|
| | | | | | Wire Width ($\mu$m) | Wire Pitch ($\mu$m) | Via Diameter ($\mu$m) | | | | |
| 321 | 900 | Cu | N$_2$ | 35 | 100 | 300 | 150 | 5.7 | 43 | 2500 | >10$^{13}$ |
| 322 | 850 | Cu | N$_2$ | 35 | 100 | 300 | 150 | 5.4 | 48 | 2800 | >10$^{13}$ |
| 323 | 930 | Cu | N$_2$ | 35 | 100 | 300 | 150 | 6.4 | 39 | 2400 | >10$^{13}$ |
| 324 | 900 | Cu | N$_2$ | 40 | 150 | 300 | 150 | 5.7 | 45 | 2500 | >10$^{13}$ |
| 325 | 910 | Cu | N$_2$ + H$_2$ | 40 | 150 | 350 | 150 | 5.5 | 48 | 2500 | >10$^{13}$ |
| 326 | 900 | Au | Air | 40 | 150 | 350 | 150 | 5.4 | 50 | 2600 | >10$^{13}$ |
| 327 | 900 | Ag | Air | 40 | 150 | 250 | 150 | 5.4 | 51 | 2700 | >10$^{13}$ |
| 328 | 880 | Cu | N$_2$ | 40 | 150 | 250 | 150 | 5.8 | 53 | 2800 | >10$^{13}$ |
| 329 | 950 | Cu | N$_2$ | 40 | 120 | 300 | 120 | 6.3 | 45 | 2500 | >10$^{13}$ |
| 330 | 930 | Ag—Pd | Air | 30 | 120 | 300 | 120 | 6.2 | 47 | 2500 | >10$^{13}$ |
| 331 | 900 | Ag—Pd | Air | 30 | 120 | 300 | 120 | 6.0 | 49 | 2400 | >10$^{13}$ |
| 332 | 900 | Au | Air | 30 | 120 | 300 | 120 | 5.8 | 51 | 2300 | >10$^{13}$ |
| 333 | 930 | Cu | N$_2$ | 30 | 120 | 250 | 100 | 6.3 | 48 | 2400 | >10$^{13}$ |
| 334 | 910 | Cu | N$_2$ | 30 | 120 | 250 | 100 | 6.1 | 50 | 2400 | >10$^{13}$ |
| 335 | 950 | Ag—Pd | Air | 30 | 120 | 250 | 100 | 6.0 | 51 | 2300 | >10$^{13}$ |
| 336 | 950 | Ag—Pd | Air | 30 | 100 | 200 | 80 | 6.0 | 51 | 2300 | >10$^{13}$ |
| 337 | 930 | Ag—Pd | Air | 40 | 100 | 250 | 120 | 6.3 | 50 | 2400 | >10$^{13}$ |
| 338 | 960 | Ag—Pd | Air | 40 | 100 | 250 | 120 | 6.1 | 52 | 2300 | >10$^{13}$ |
| 339 | 900 | Ag | Air | 40 | 100 | 250 | 120 | 6.0 | 54 | 2200 | >10$^{13}$ |
| 340 | 900 | Cu | N$_2$ | 40 | 80 | 200 | 80 | 6.1 | 55 | 2100 | >10$^{13}$ |

When the content of α-quartz powder is less than 10 wt %, the dielectric constant become higher than 7. On the other hand, if the content of α-quartz powder exceed 30 wt %, satisfactory sintering can not be carried out so that the insulation resistance becomes lower and the bending strength become lower than 2,000 kg/cm$^2$.

When the particle size of alumina powder used becomes lower than 0.5 $\mu$m or higher than 3 $\mu$m, the particle size of borosilicate magnesium glass powder become lower than 1 $\mu$m or higher than 5 $\mu$m and the particle size of α-quartz powder become lower than 0.5 $\mu$m or higher than 10 $\mu$m, the mixed material powder can not be sintered satisfactorily, so that the resulting multilayer glass ceramic substrate shows very poor reliability and hence can not be used in practical uses.

By the same reason as Example 2, practical multilayer glass ceramic substrate can not be obtained outside the proportions according to the present invention (12 to 59.6 wt % of alumina, 18 to 69.6 wt % of borosilicate magnesium glass and higher than 1 wt % of cordierite crystal).

By the same reason as Example 2, if the content of magnesium in the borosilicate magnesium glass used becomes less than 5 wt % in term of magnesium oxide, no or little cordierite crystal is produced by sintering operation.

We claim:

1. A process for producing a multilayer glass ceramic substrate by the steps of mixing material powders, preparing green sheets from slurry of the mixed material powders, forming via halls in said green sheets, printing wiring conductors on said green sheets and filling said via halls with conductor, laminating a plurality printed sheets, compressing the laminated sheets under heat and then sintering compressed sheets at a temperature below 1,000° C., characterized in that said mixed material powders consist of 30 to 60 wt % of alumina powder and 70 to 40 wt % of borosilicate magnesium glass powder.

2. The process set forth in claim 1 wherein alumina powder has the average particle size of 0.5 to 3 μm and borosilicate magnesium glass powder has the average particle size of 1 to 5 μm.

3. The process set forth in claim 2 wherein the content of magnesium in said borosilicate magnesium glass is more than 5 wt % in term of magnesium oxide.

4. The process set forth in claim 1 wherein a third powder selected from a group consisting of quartz glass, α-quartz and mullite is added to said material powders in such proportions as 10 to 50 wt % of alumina powder, 40 to 70 wt % of borosilicate magnesium glass powder and 10 to 50 wt % of said third powder, the sum of all powders being 100 wt %.

5. The process set forth in claim 4 wherein the content of magnesium in said borosilicate magnesium glass is more than 5 wt % in term of magnesium oxide.

6. The process set forth in claim 1 wherein said third powder has the average particle size of 0.5 to 10 μm.

7. The process set forth in claim 6 wherein the content of magnesium in said borosilicate magnesium glass is more than 5 wt % in term of magnesium oxide.

8. The process set forth in claim 1 wherein the content of magnesium in said borosilicate magnesium glass is more than 5 wt % in term of magnesium oxide.

* * * * *